United States Patent
Lou et al.

(10) Patent No.: US 8,207,615 B2
(45) Date of Patent: Jun. 26, 2012

(54) CHIP PACKAGE AND METHOD FOR FABRICATING THE SAME

(76) Inventors: Bai-Yao Lou, Hsinchu (TW); Tsang-Yu Liu, Zhubei (TW); Long-Sheng Yeou, Hsinchu (TW)

( * ) Notice: Subject to any disclaimer, the term of this patent is extended or adjusted under 35 U.S.C. 154(b) by 0 days.

(21) Appl. No.: 13/010,478

(22) Filed: Jan. 20, 2011

(65) Prior Publication Data

US 2011/0175236 A1    Jul. 21, 2011

Related U.S. Application Data

(60) Provisional application No. 61/296,857, filed on Jan. 20, 2010.

(51) Int. Cl.
*H01L 23/48* (2006.01)
(52) U.S. Cl. ............. 257/774; 257/701; 257/E23.011; 438/149; 438/609
(58) Field of Classification Search .......... 257/774, 257/701, E23.011; 438/149, 609
See application file for complete search history.

(56) References Cited

U.S. PATENT DOCUMENTS

| | | | |
|---|---|---|---|
| 6,448,117 B1 * | 9/2002 | Jen et al. | 438/160 |
| 6,627,824 B1 * | 9/2003 | Lin | 174/268 |
| 7,737,562 B2 * | 6/2010 | Higaki et al. | 257/774 |

* cited by examiner

*Primary Examiner* — Howard Weiss
*Assistant Examiner* — Steven Rao
(74) *Attorney, Agent, or Firm* — Liu & Liu

(57) ABSTRACT

An embodiment of the invention provides a chip package, which includes a substrate having an upper surface and a lower surface, a chip disposed in or on the substrate, a pad disposed in or on the substrate and electrically connected to the chip, a hole extending from the lower surface toward the upper surface, exposing the pad, wherein a lower opening of the hole near the lower surface has a width that is shorter than that of an upper opening of the hole near the upper surface, an insulating layer located overlying a sidewall of the hole, and a conducting layer located overlying the insulating layer and electrically connected to the pad.

20 Claims, 11 Drawing Sheets

CHIP PACKAGE AND METHOD FOR FABRICATING THE SAME

CROSS REFERENCE

This Application claims the benefit of U.S. Provisional Application No. 61/296,857, filed on Jan. 20, 2010, the entirety of which is incorporated by reference herein.

BACKGROUND OF THE INVENTION

1. Field of the Invention

The present invention relates to a chip package and a fabrication method thereof, and in particular relates to a chip package having a through substrate via and a fabrication method thereof.

2. Description of the Related Art

For a chip package, such as a light detecting chip package or a light emitting chip package, light receiving and emitting are often negatively affected by a medium thereof (such as a glass). In addition, reliability of the chip package may often be affected by stress thereto. Also, when fabricating a chip package, a complicated patterning process is often needed, which increases fabrication costs.

Therefore, a chip packaging technique to reduce or solve the problems mentioned above is desired.

BRIEF SUMMARY OF THE INVENTION

An embodiment of the present invention provides a chip package including a substrate having an upper surface and a lower surface, a chip disposed in or on the substrate, a pad disposed in or on the substrate, wherein the pad is electrically connected to the chip, a hole extending from the lower surface toward the upper surface, exposing the pad, wherein a lower opening of the hole near the lower surface has a width that is shorter than that of an upper opening of the hole near the upper surface, an insulating layer located on a sidewall of the hole, and a conducting layer located on the insulating layer and electrically connected to the pad.

An embodiment of the present invention provides a method for forming a chip package including providing a substrate having an upper surface and a lower surface, wherein the substrate comprises a chip and a pad therein or thereon and the pad is electrically connected to the chip, removing a portion of the substrate from the lower surface of the substrate to form a hole exposing the pad, wherein a lower opening of the hole near the lower surface has a width that is shorter than that of an upper opening of the hole near the upper surface, forming an insulating layer on a sidewall and a bottom portion of the hole, removing a portion of the insulating layer on the bottom portion of the hole to expose a portion of the pad, and forming a conducting layer on the sidewall and the bottom portion of the hole, wherein the conducting layer electrically contacts the pad.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

It is understood, that the following disclosure provides many different embodiments, or examples, for implementing different features of the invention. Specific examples of components and arrangements are described below to simplify the present disclosure. These are, of course, merely examples and are not intended to be limiting. In addition, the present disclosure may repeat reference numbers and/or letters in the various examples. This repetition is for the purpose of simplicity and clarity and does not in itself dictate a relationship between the various embodiments and/or configurations discussed. Furthermore, descriptions of a first layer "on," "overlying," (and like descriptions) a second layer include embodiments where the first and second layers are in direct contact and those where one or more layers are interposing the first and second layers.

Figure 1A:
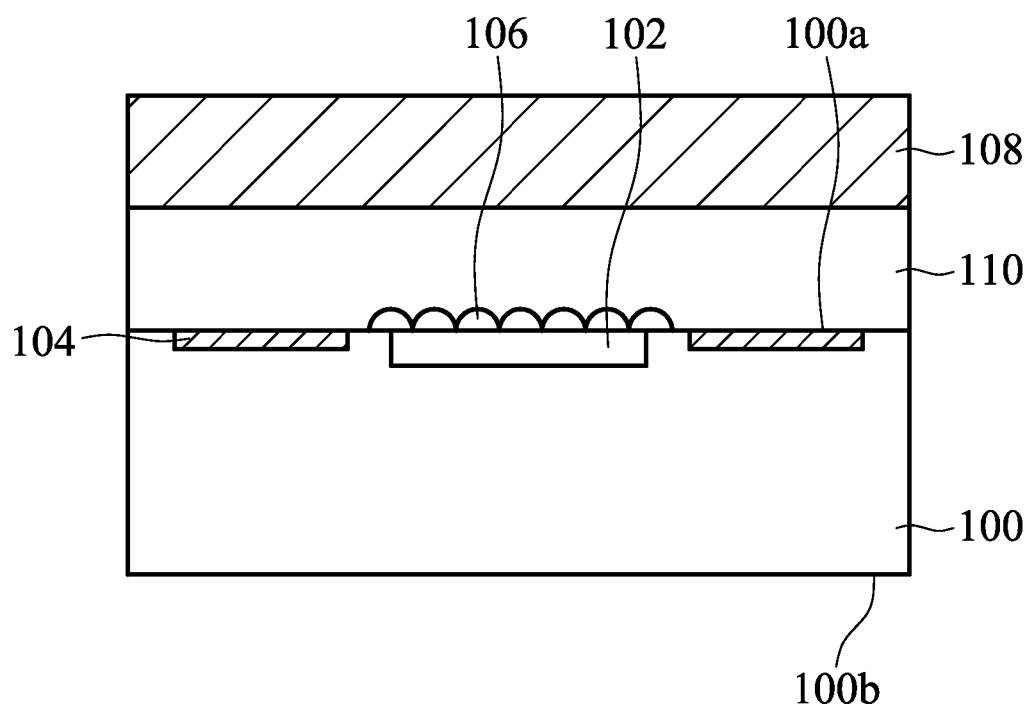
FIGS. 1A-1G are cross-sectional views showing the steps of fabricating a chip package according to an embodiment of the present invention.

FIGS. 1A-1G are cross-sectional views showing the steps of fabricating a chip package according to an embodiment of the present invention. As shown in FIG. 1A, a substrate 100 is provided first, which has an upper surface 100a and an opposing lower surface 100b. The substrate 100 may comprise a semiconductor material, ceramic material, or polymer material. In one embodiment, the substrate 100 is a silicon substrate. In another embodiment, the substrate 100 is a silicon wafer. It is preferable that the wafer-level packaging and the dicing process are performed to form a plurality of chip packages simultaneously, so that fabrication cost and time may be reduced.

As shown in FIG. 1A, a chip 102 may be disposed or formed in or on the substrate 100. For example, the chip 102 may comprise, but is not limited to, a logic chip, micro electro mechanical system (MEMS) chip, micro fluidic system chip, physical sensor chip for detecting physical changes such as detecting heat, light, or pressure, RF device chip, accelerator chip, gyroscope chip, micro actuator chip, surface acoustic wave device chip, pressure sensor chip, ink printer head chip, light emitting device chip, or solar cell chip. In this embodiment, a photo detecting chip such as an image sensor chip is adopted as the chip 102, for example. In this embodiment, an optical lens 106 may be optionally disposed overlying the chip 102. The optical lens 106 may include a lens array. For example, the optical lens 106 may be a micro lens array. Alternatively, in another embodiment, a light emitting chip such as a light emitting diode chip is adopted as the chip 102.

As shown in FIG. 1A, the substrate 100 comprises a pad 104 therein or thereon, which is electrically connected to the chip 102. Although conducting routes between the chip 102 and the pad 104 are not shown in the drawing, one skilled in the art should understand that any kind of suitable conducting wire pattern may be formed to electrically connect the pad 104 and the chip 102. In addition, in one embodiment, other than the embodiment shown in FIG. 1A, the pad 104 may be a portion of the chip 102. The material of the pad 104 may be typically a metal material such as aluminum, copper, gold, the like thereof, or combinations thereof.

In addition, as shown in FIG. 1A, in one embodiment, a temporary substrate 108 may be optionally adhered on the substrate by an adhesive 110. The temporary substrate 108 temporarily serves as a support substrate in a subsequent grinding process; thus the temporary substrate 108 preferably has a substantially planar upper surface. The material of the temporary substrate 108 may comprise, for example, a semiconductor material, ceramic material, or metal material. In one embodiment, the temporary substrate 108 is preferably a silicon substrate. Because an infrared light can penetrate through a silicon substrate, a preformed alignment mark (not shown) in the substrate may be detected when a silicon substrate is used as the temporary substrate 108, to ensure precise adhesion between the temporary substrate 108 and the substrate 100. In one embodiment, it is preferable to use a wafer-level packaging process to form the chip package. Thus, it is preferable that a silicon wafer is adopted as the temporary substrate 108. The adhesive 110 is preferable a removable material. For example, an energy may be applied to the adhesive 110 to break its chemical bonds, which helps to remove the temporary substrate 108 from the substrate 100. In one embodiment, the adhesive 110 is removed by heat or irradiation with a light such as a laser light or ultraviolet light. In one embodiment, the temporary substrate 108 may be removed and reused after the adhesive 110 is removed. In addition, when a wafer-level packaging process is performed to form the chip package, it is preferable to remove the temporary substrate 108 first and then perform a dicing process on the wafer to form a plurality of chip packages.

Figure 1B:
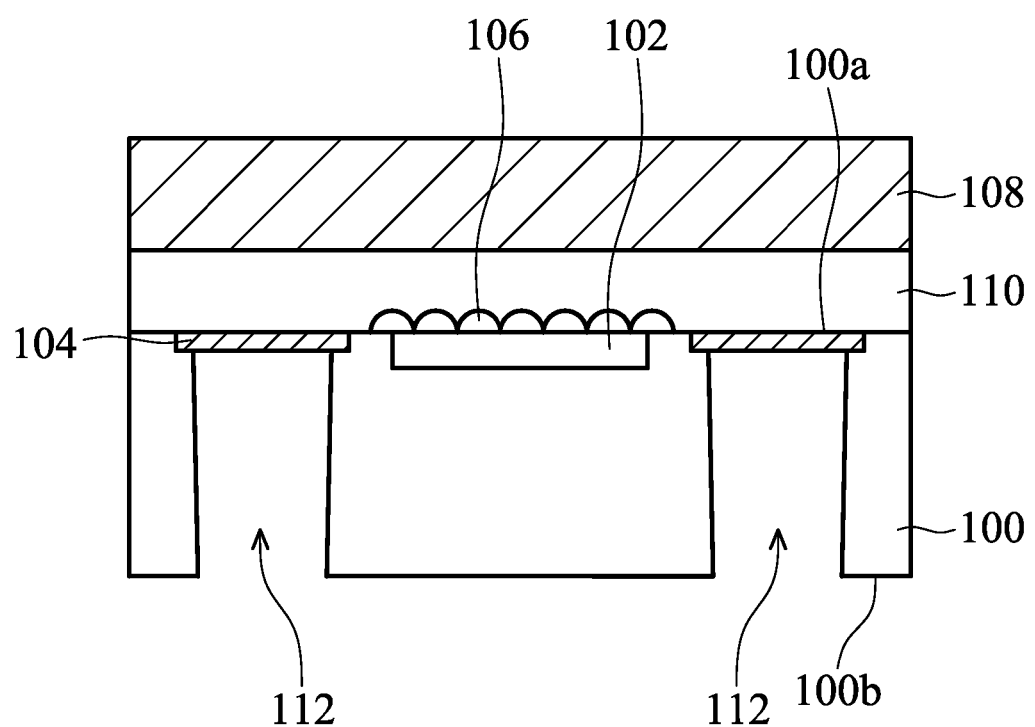

Then, as shown in FIG. 1B, a portion of the substrate 100 is removed from the lower surface 100b of the substrate 100 to form a hole 112 exposing the pad 104. In one embodiment, a lower opening of the hole 112 near the lower surface 100b has a width that is shorter than that of an upper opening of the hole 112 near the upper surface 100a. Thus, the hole 112 has a conical or pyramidical profile with steep sidewall. Thus, a sidewall of the hole 112 inclines to the surface of the substrate 100. The forming of the hole 112 comprises removing the substrate 100 by a dry etching process. For example, a main etching process is first performed to remove the substrate, and then an over etching process is performed by changing process factors of the etching process. For example, process factors such as power, pressure, and concentration of the etching gas may be tuned to form a hole having a conical or pyramidical profile with steep sidewall.

Figure 2A:
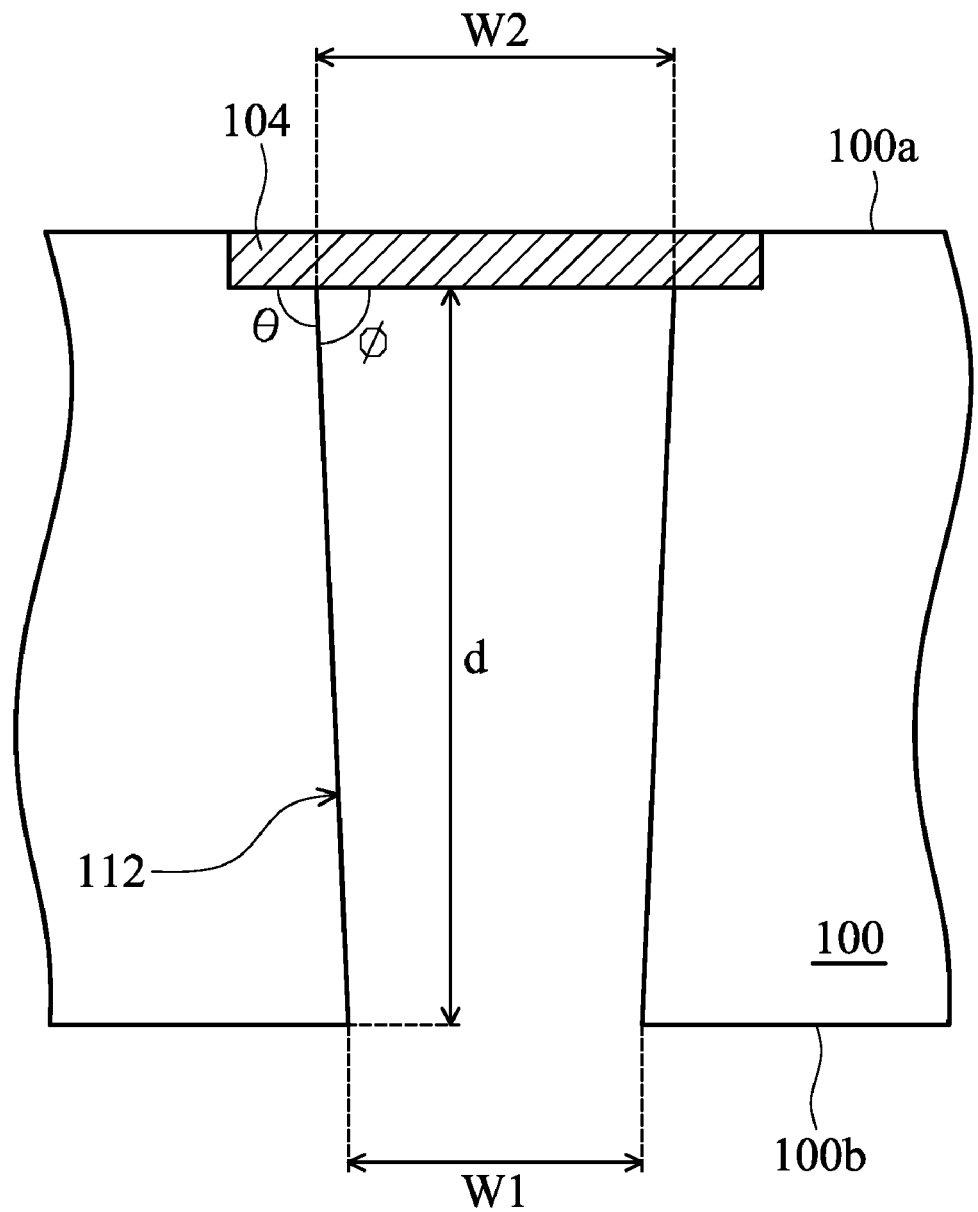
FIGS. 2A-2C are partially enlarged cross-sectional views corresponding to the chip package of the embodiment shown in FIGS. 1B-1D.

FIG. 2A is a partially enlarged cross-sectional view corresponding to the structure shown in FIG. 1B, which shows the hole 112, in more detail, according to an embodiment of the invention. As shown in FIG. 2A, a width W1 of the lower opening of the hole 112 is shorter than a width W2 of the upper opening of the hole 112. The opening of the hole 112 may have a variety of shapes such as a circular, ellipse, square, or rectangular shape. When the opening is circular shaped, the width mentioned above is a diameter of the circular shape opening.

As shown in FIG. 2A, in this embodiment, because a lower surface of the pad 104 is substantially parallel to the upper surface of the substrate 100, the angle θ between the sidewall of the hole 112 and the lower surface of the pad 104 substantially equals to the angle between the sidewall of the hole 112 and the upper surface 100a. In one embodiment, the angle θ is more than 90 degrees and less than or equal to 92 degrees. The angle θ may be determined by using, for example, a trigonometric function. The depth d, width W1 of the lower opening, and width W2 of the upper opening of the hole 112 may be first measured. Then, as shown in the drawing, the angle ψ equals $\tan^{-1}[2d/(W2-W1)]$. Thus, it is understood that the angle θ equals $(\pi-\psi)$.

Figure 1C:
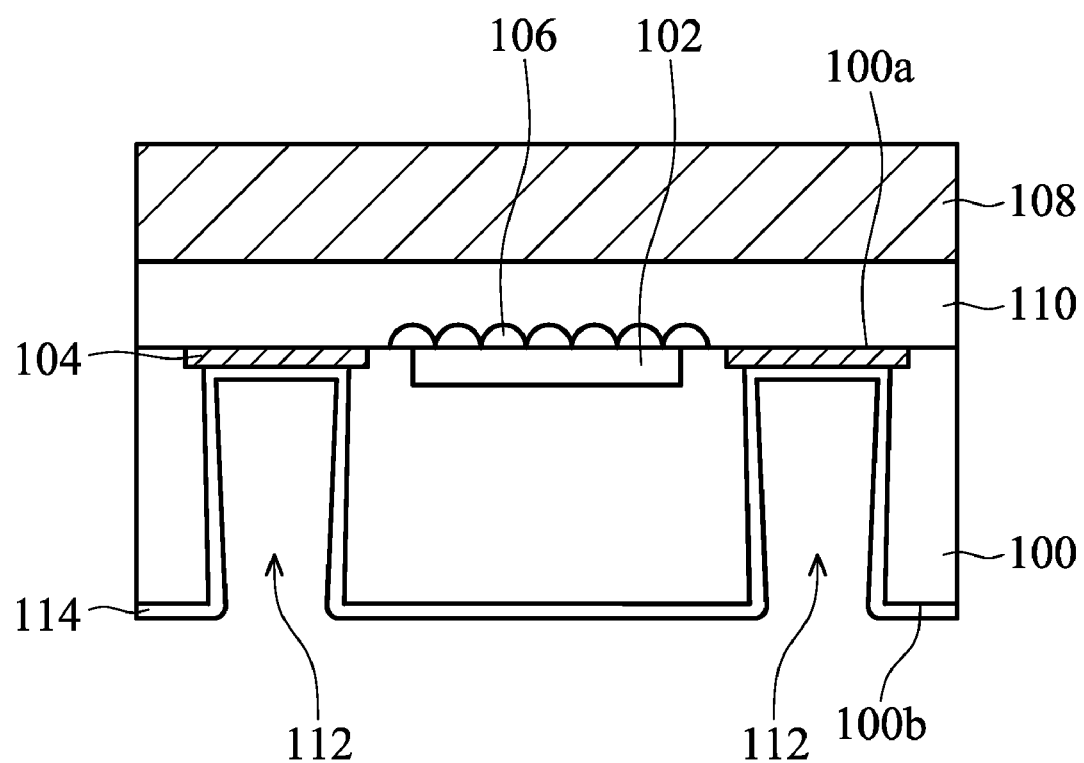

As shown in FIG. 1C, after the hole 112 is formed, an insulating layer 114 is formed on the sidewall and the bottom portion of the hole 112. The material of the insulating layer 114 may comprise, for example, an epoxy resin, solder mask material, or other suitable insulating material, such as inorganic materials including silicon oxide, silicon nitride, silicon oxynitride, metal oxide, or combinations thereof, or organic polymer materials including polyimide, butylcyclobutene (BCB, Dow Chemical Co.), parylene, polynaphthalenes, fluorocarbons, or acrylates and so on. The method for fabricating the insulating layer 114 may comprise a coating method, such as a spin coating, spray coating, or curtain coating method, or other suitable deposition methods, such as a liquid phase deposition, physical vapor deposition, chemical vapor deposition, low pressure chemical vapor deposition, plasma enhanced chemical vapor deposition, rapid thermal chemical vapor deposition, or atmospheric pressure vapor deposition method. In one embodiment, the substrate 100 is a silicon substrate and the insulating layer 114 is a silicon oxide layer obtained by performing a thermal oxidation process to the silicon substrate. In this embodiment, the insulating layer 114 covers the pad 104 and is extended overlying the lower surface 100b of the substrate 100.

Figure 2B:
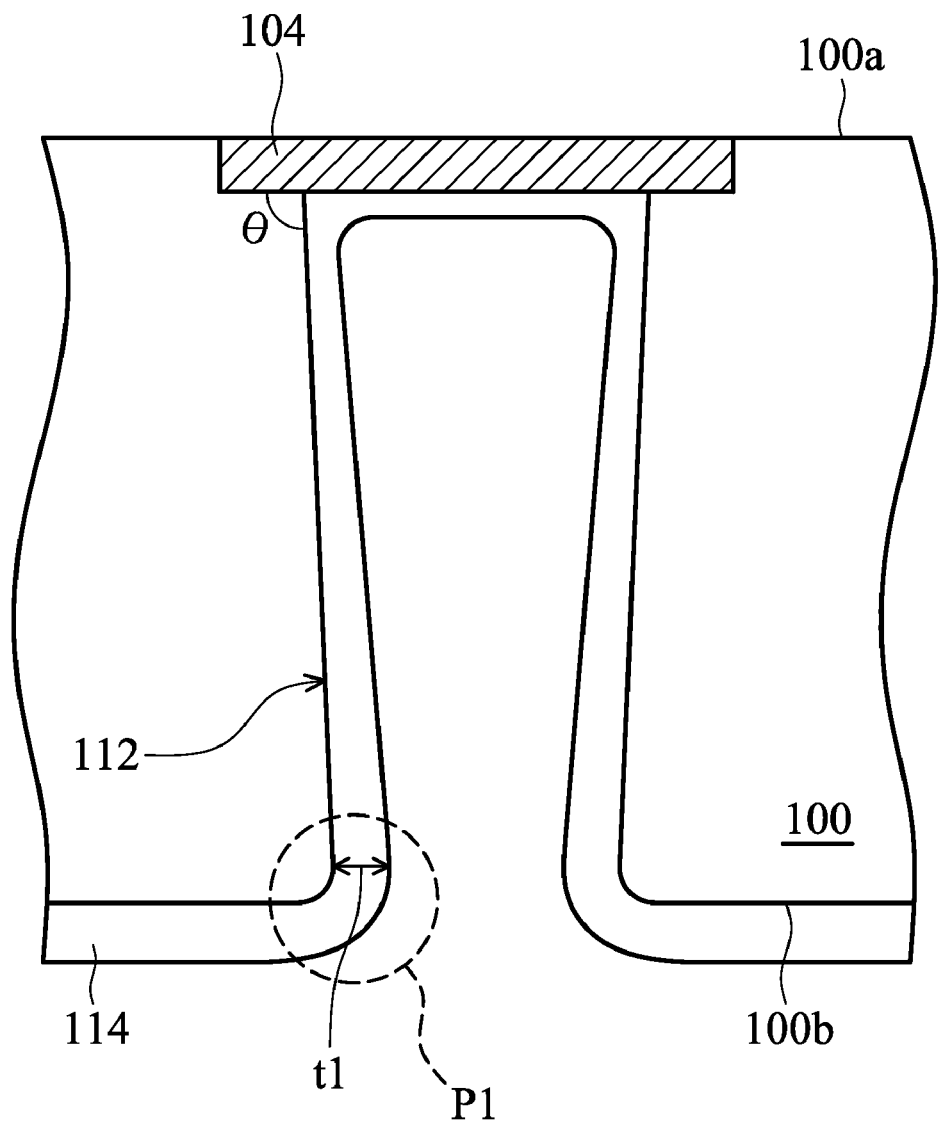

FIG. 2B is a partially enlarged cross-sectional view corresponding to the structure shown in FIG. 1C, which shows that a portion P1 of the insulating layer 114 on the sidewall of the hole 112 and near the lower surface 100b has a thickness t1.

Figure 1D:
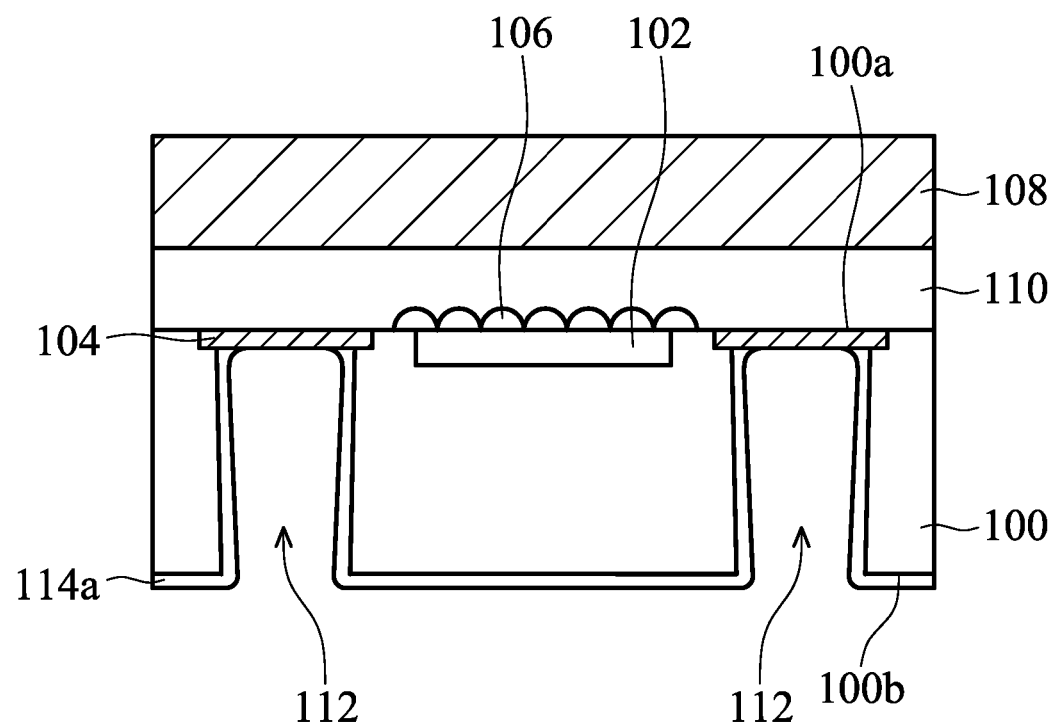
Figure 2C:
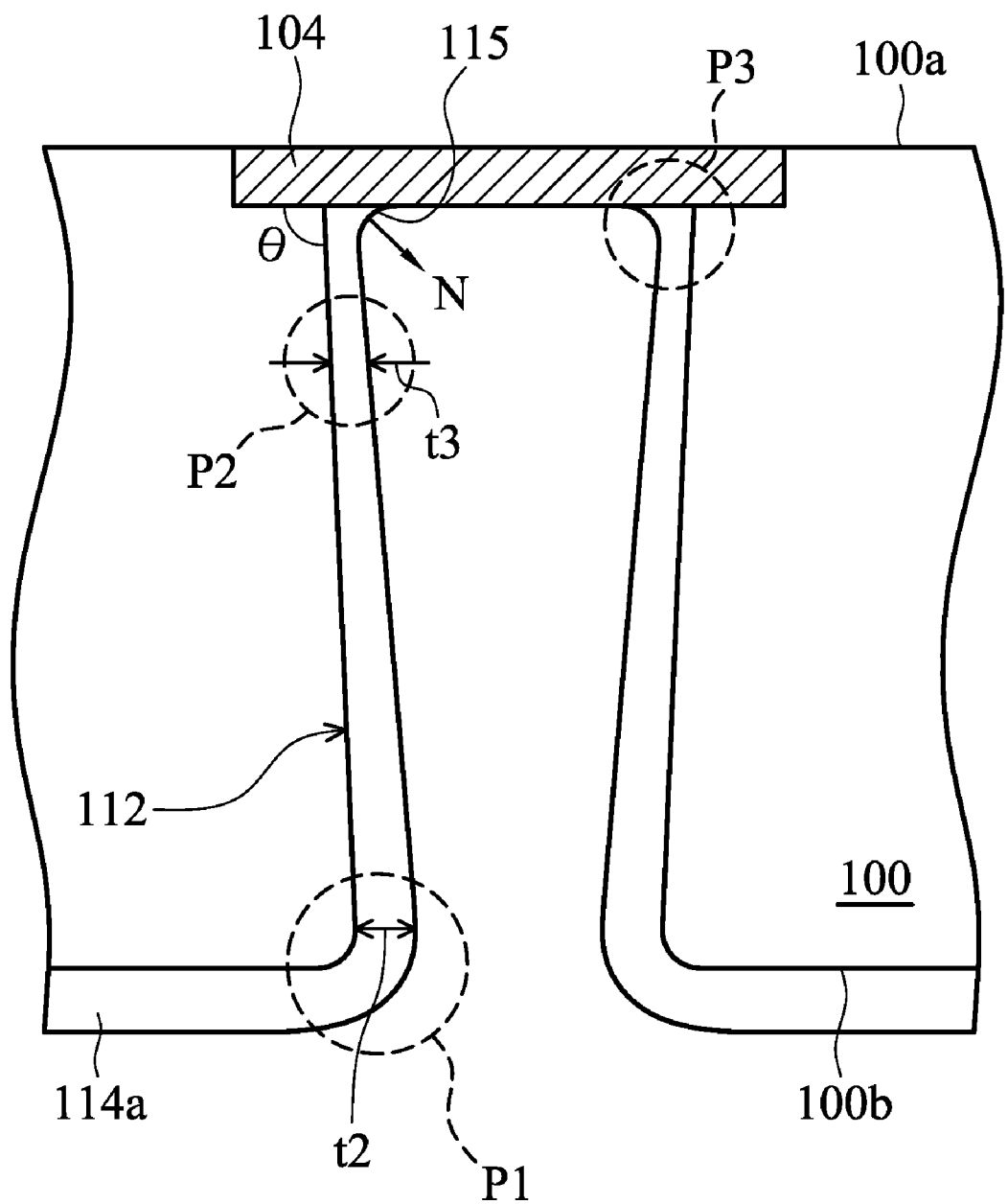

As shown in FIG. 1D, a portion of the insulating layer on the bottom portion of the hole 112 is removed to form a patterned insulating layer 114a which exposes a portion of the pad 104. FIG. 2C is a partially enlarged cross-sectional view corresponding to the structure shown in FIG. 1D. Referring to FIGS. 2B and 2C, in one embodiment, the portion P1 of the insulating layer 114 near the lower surface 100b is used as a mask to perform an etching process to the insulating layer 144 such that the portion of the insulating layer 114 on the bottom portion of the hole 112 is removed to expose the pad 104. Because the opening of the hole 112 near the lower surface 100b has a shorter width, the portion P1 of the insulating layer 114a may naturally block a portion of the etchant to prevent the insulating layer on the sidewall to be completely etched and removed. Thus, it is not necessary to form a patterned photoresist layer on the insulating layer 114 to pattern the insulating layer into the patterned insulating layer 114a and form the opening exposing the pad 104.

In one embodiment, because the etching process is performed without fabricating a patterned photoresist layer on the insulating layer 114, thicknesses of other portions of the insulating layer 114 which contact the etchant will become thinner after the portion of the insulating layer on the bottom portion of the hole 112 is removed. For example, the thickness of the portion P1 of the insulating layer is decreased from the thickness t1 to a thickness t2. In addition, the thickness t2 of the portion P1 of the insulating layer near the lower surface 100b is larger than a thickness t3 of a portion of the insulating layer near the upper surface 100a. In addition, in one embodiment, a corner portion P3 of the insulating layer is formed after the insulating layer is partially removed. The corner portion P3 is located at a corner between the sidewall of the hole 112 and the pad 104 and is extended overlying a portion of the pad 104. In one embodiment, the corner portion P3 of the insulating layer comprises an inclined surface 115 and a normal vector of the inclined surface 115 faces the lower surface 100b of the substrate.

Figure 1E:
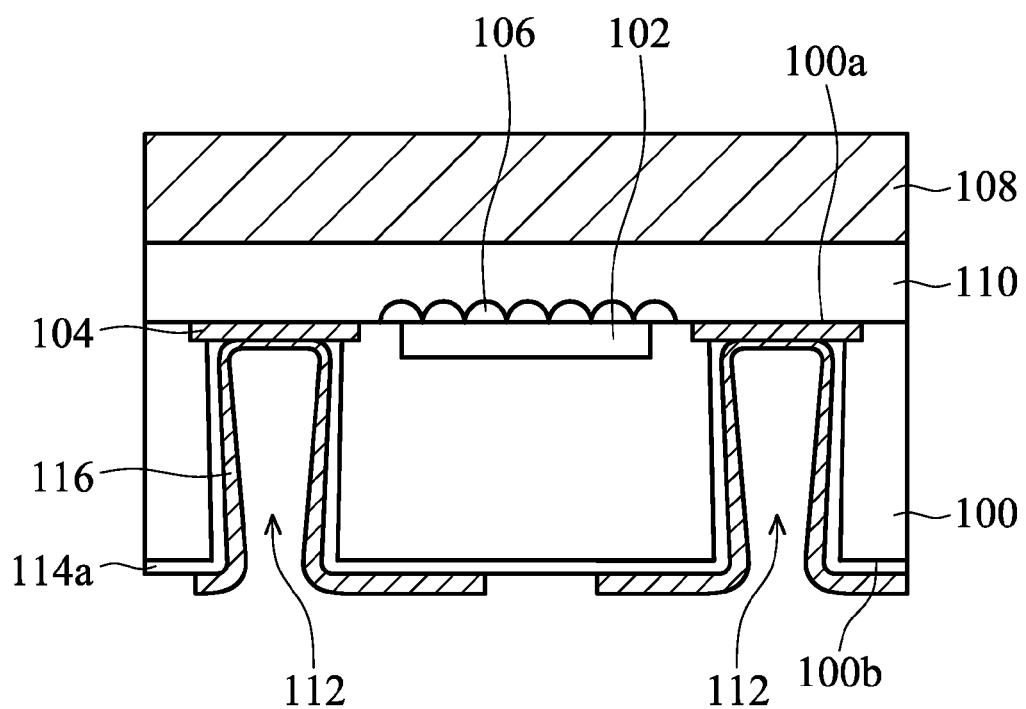

Referring to FIG. 1E, a conducting layer 116 is then formed on the sidewall and the bottom portion of the hole 112. The conducting layer 116 electrically contacts the pad 104 and thus also electrically connects to the chip 102. The material of the conducting layer 116 may comprise, for example, a copper, aluminum, gold, platinum material, or combinations thereof. The conducting layer 116 may be formed by, for example, a physical vapor deposition, chemical vapor deposition, electroplating, or electroless plating process.

Figure 1F:
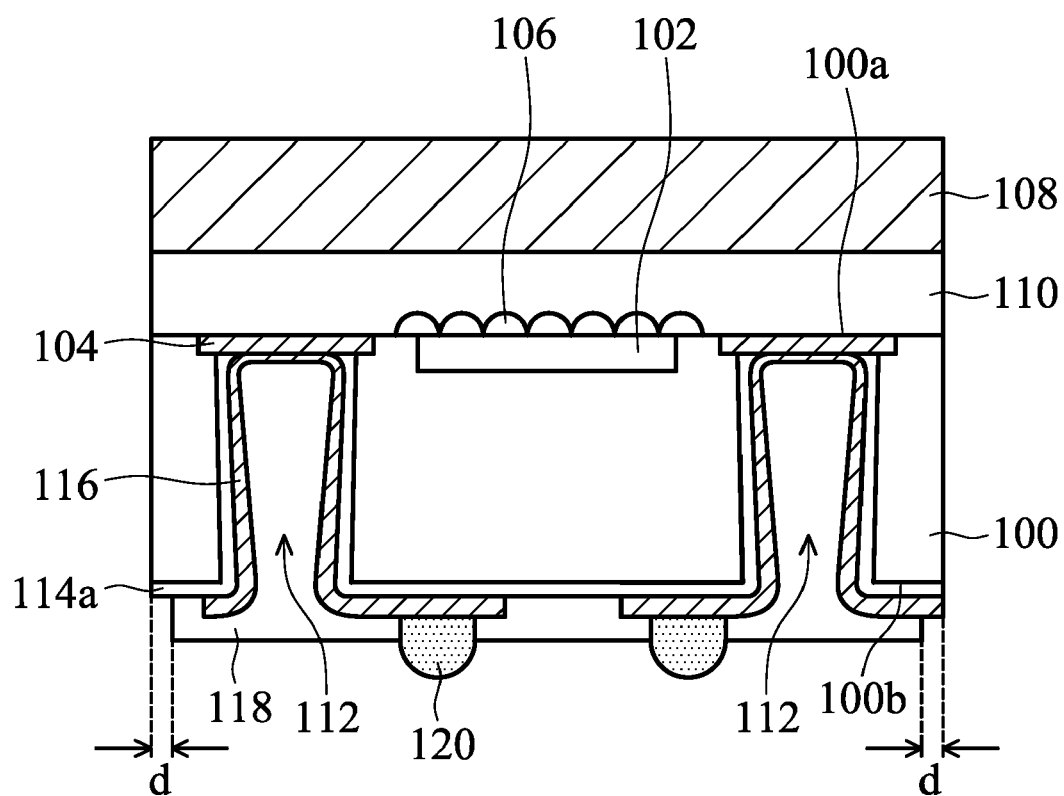

As shown in FIG. 1F, a patterned passivation layer 118 is then formed overlying the lower surface 100b of the substrate 100, which exposes a portion of the conducting layer 116 extending and overlying the lower surface 100b. A bumping process may be performed on the exposed conducting layer 116 to form a conducting bump 120 which may be integrated with other electronic elements. For example, the chip package may be disposed on a printed circuit board by a flip-chip method.

Figure 3:
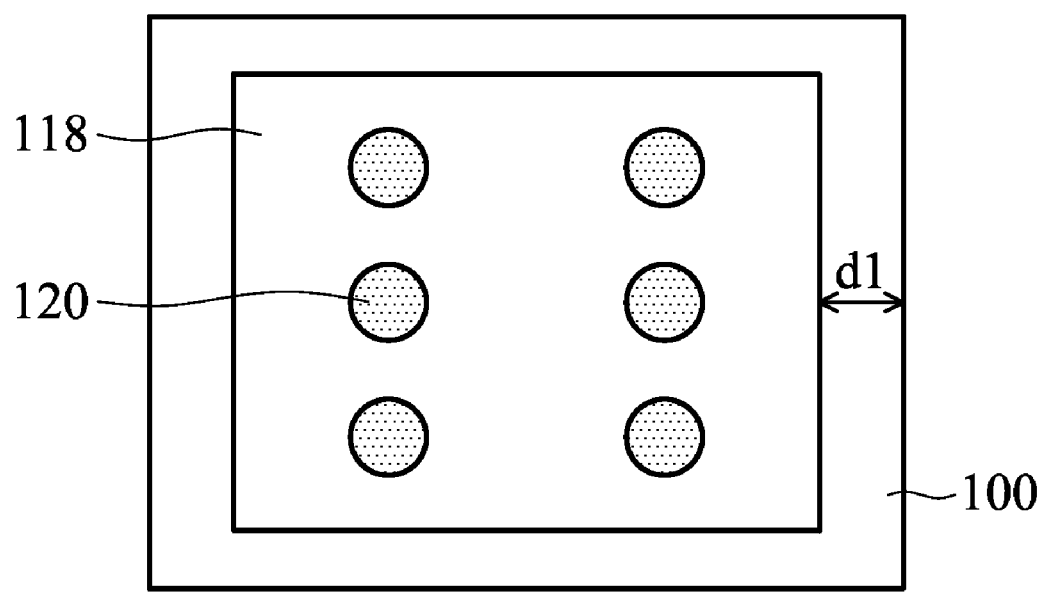
FIG. 3 is a top view showing the lower surface of the embodiment shown in FIG. 1F.

FIG. 3 is a top view showing the lower surface 100b of the embodiment shown in FIG. 1F, wherein the passivation layer 118 is separated from an edge of the substrate 100 by a distance d1 without contacting the edge of the substrate 100. Because an edge of a substrate or an edge of a stack of material layers may be easily damaged by stress, removing the passivation layer 118 with higher stress, which is located on the edge when the patterned passivation layer is formed, will help to improve reliability of the chip package.

Figure 1G:
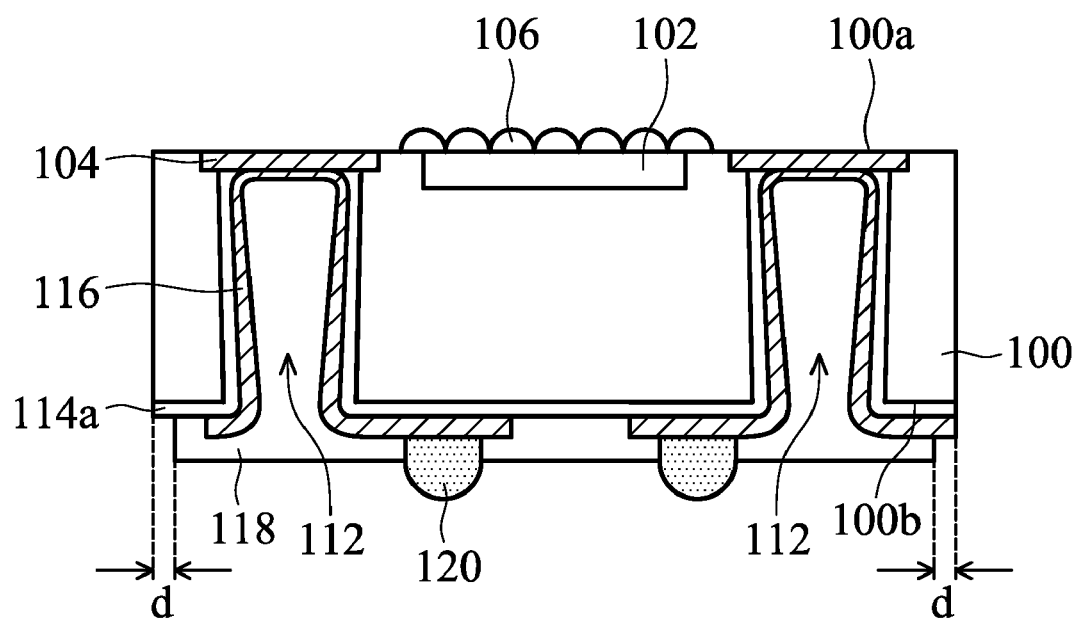

As shown in FIG. 1G, the adhesive 110 and the temporary substrate 110 are removed. As mentioned above, chemical bonds of the compound in the adhesive 110 may be broken by heat or irradiation from a light. Thus, the adhesive 110 is removed and the temporary substrate may be removed and reused. In one embodiment, a silicon wafer is used as the substrate 100 to perform a wafer-level packaging process. In this case, after the adhesive 110 and the temporary substrate 108 are removed, a dicing process may be further performed to separate a plurality of formed chip packaged.

As shown in FIG. 1G, in one embodiment, the chip 102 is a light detecting chip (or a light emitting chip). A light detecting surface (or a light emerging surface) of the light detecting chip (or the light emitting chip) does not directly contact the adhesive. Thus, a light is substantially not absorbed or refracted by another medium. In another case, an optical lens 106 and/or a lens module (not shown) are/is disposed on the chip 102. In this case, the light detecting surface (or the light emerging surface) of the light detecting chip (or the light emitting chip) still does not directly contact the adhesive. Thus, a light is substantially not absorbed or refracted by another medium such as an adhesive. Thus, light may be received or emitted more successfully.

The removable adhesive and the temporary substrate are used in an embodiment of the invention such that the packaging process of the chip may be performed smoothly. After the adhesive and the temporary substrate are removed, light may be received or emitted more successfully by the chip package. Due to the fabricating process of the hole having the conical or pyramidical profile with steep sidewall, no additional photolithography process is needed when the opening of the insulating layer exposing the pad is formed. Fabrication cost and time may be significantly reduced. Also, damage of material layers in the chip package may be prevented, which effectively improves yield and reliability of the chip package.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A chip package, comprising:
    a semiconductor substrate having an upper surface and a lower surface;
    an electronic element disposed in or on the upper surface of the substrate;
    a pad disposed in or on the upper surface of the substrate, wherein the pad is electrically connected to the electronic element;
    a hole provided in the substrate, extending with progressively increasing width from a lower opening in the lower surface toward an upper opening in the upper surface, exposing the pad, wherein the upper opening is wider than the lower opening;
    an insulating layer located on a sidewall of the hole; and
    a conducting layer located on the insulating layer and electrically connected to the pad.

2. The chip package as claimed in claim 1, wherein an angle between the sidewall of the hole and the upper surface of the substrate is more than 90 degrees and less than or equal to 92 degrees.

3. The chip package as claimed in claim 1, wherein a first portion of the insulating layer near the lower surface has a thickness larger than that of a second portion of the insulating layer near the upper surface.

4. The chip package as claimed in claim 3, wherein the insulating layer comprises a corner portion located at a corner between the sidewall of the hole and the pad and extending and overlying a portion of a surface of the pad.

5. The chip package as claimed in claim 4, wherein the corner portion of the insulating layer comprises an inclined surface, wherein a normal vector of the inclined surface faces the lower surface of the substrate.

6. The chip package as claimed in claim 1, wherein a first portion of the conducting layer near the lower surface of the substrate has a width larger than that of the second portion of the conducting layer near the upper surface of the substrate.

7. The chip package as claimed in claim 1, wherein the electronic element is a light detecting element or a light emitting element.

8. The chip package as claimed in claim 7, wherein the electronic element comprises a light detecting surface or a light emerging surface that faces away from the upper surface of the substrate, wherein the light detecting surface or the light emerging surface of the electronic element does not directly contact with an adhesive disposed over the upper surface of the substrate.

9. The chip package as claimed in claim 7, further comprising an optical lens disposed overlying the electronic element, wherein the electronic element does not directly contact with an adhesive disposed over the upper surface of the substrate.

10. The chip package as claimed in claim 1, further comprising a passivation layer located on the lower surface of the substrate and separated from an edge of the substrate by a distance without contacting the edge.

11. A method for fabricating a chip package, comprising:
    providing a semiconductor substrate having an upper surface and a lower surface,
    wherein the substrate comprises an electronic element and a pad provided in or on the upper surface of the substrate and the pad is electrically connected to the electronic element;

removing a portion of the substrate to form a hole in the substrate, extending with progressively increasing width from a lower opening in the lower surface toward an upper opening in the upper surface, exposing the pad, wherein the upper opening is wider than the lower opening;

forming an insulating layer on a sidewall and a bottom portion of the hole;

removing a portion of the insulating layer on the bottom portion of the hole to expose a portion of the pad; and forming a conducting layer on the sidewall and the bottom portion of the hole, wherein the conducting layer electrically contacts the pad.

12. The method for fabricating a chip package as claimed in claim 11, wherein the step of removing the insulating layer comprises performing an etching process to the insulating layer with a first portion of the insulating layer near the lower surface as a mask to remove the portion of the insulating layer on the bottom portion of the hole to expose the portion of the pad.

13. The method for fabricating a chip package as claimed in claim 12, wherein after the portion of the insulating layer is removed, a thickness of the first portion of the insulating layer becomes thinner.

14. The method for fabricating a chip package as claimed in claim 12, wherein after the portion of the insulating layer is removed, a corner portion of the insulating layer is formed, wherein the corner portion is located at a corner between the sidewall of the hole and the pad and extending and overlying a portion of a surface of the pad.

15. The method for fabricating a chip package as claimed in claim 14, wherein the corner portion of the insulating layer comprises an inclined surface, and the inclined surface has a normal vector facing the lower surface of the substrate.

16. The method for fabricating a chip package as claimed in claim 11, wherein no step of fabricating a patterned photoresist layer on the insulating layer is performed between the step of fabricating the insulating layer and the step of removing the portion of the insulating.

17. The method for fabricating a chip package as claimed in claim 11, further comprising thinning the substrate from the lower surface of the substrate before the hole is formed.

18. The method for fabricating a chip package as claimed in claim 17, before the substrate is thinned, further comprising:

adhering a temporary substrate on the upper surface of the substrate by an adhesive; and thinning the substrate from the lower surface by using the temporary substrate as a support.

19. The method for fabricating a chip package as claimed in claim 18, further comprising fabricating a passivation layer on the lower surface of the substrate after the conducting layer is formed, wherein the passivation layer is separated from an edge of the substrate by a distance without contacting the edge.

20. The method for fabricating a chip package as claimed in claim 19, further comprising removing the adhesive and the temporary substrate after the passivation layer is formed.

* * * * *